(12) United States Patent
Ranish et al.

(10) Patent No.: US 9,184,085 B2
(45) Date of Patent: *Nov. 10, 2015

(54) SUBSTRATE SUPPORTING EDGE RING WITH COATING FOR IMPROVED SOAK PERFORMANCE

(71) Applicant: Applied Materials, Inc., Santa Clara, CA (US)

(72) Inventors: Joseph M. Ranish, San Jose, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/658,793

(22) Filed: Mar. 16, 2015

(65) Prior Publication Data

US 2015/0187631 A1    Jul. 2, 2015

Related U.S. Application Data

(63) Continuation of application No. 13/486,807, filed on Jun. 1, 2012, now Pat. No. 8,979,087.

(60) Provisional application No. 61/513,492, filed on Jul. 29, 2011.

(51) Int. Cl.
*B23Q 3/00* (2006.01)
*H01L 21/687* (2006.01)

(52) U.S. Cl.
CPC .... *H01L 21/68757* (2013.01); *H01L 21/68735* (2013.01)

(58) Field of Classification Search
USPC .......................... 269/303, 305, 909
See application file for complete search history.

(56) References Cited

U.S. PATENT DOCUMENTS

| | | |
|---|---|---|
| 5,848,889 A | 12/1998 | Tietz et al. |
| 6,200,388 B1 | 3/2001 | Jennings |
| 6,280,183 B1 | 8/2001 | Mayur et al. |
| 6,395,363 B1 * | 5/2002 | Ballance et al. ............ 428/64.1 |
| 6,888,104 B1 | 5/2005 | Ranish et al. |
| 7,127,367 B2 | 10/2006 | Ramachandran et al. |
| 7,906,402 B2 | 3/2011 | Ranish et al. |
| 2005/0022746 A1 * | 2/2005 | Lampe et al. ................. 118/728 |

FOREIGN PATENT DOCUMENTS

JP    08236600 A    9/1996

OTHER PUBLICATIONS

International Search Report dated Nov. 30, 2012 for PCT/US2012/045453.

* cited by examiner

*Primary Examiner* — Lee D Wilson
*Assistant Examiner* — Shantese McDonald
(74) *Attorney, Agent, or Firm* — Patterson & Sheridan, LLP

(57) ABSTRACT

Embodiments of the present invention provide a substrate supporting edge ring for supporting a substrate. In one embodiment, a substrate support ring is provided. The substrate support ring comprises an annular body. The annular body comprises an outer band extending radially inward from an outer annular sidewall; and a substrate supporting region extending inward from an inner portion of the outer band, wherein the annular body comprises a first material that is exposed and at least a portion of the substrate supporting region is covered with a coating comprising a second material that is different than the first material.

21 Claims, 4 Drawing Sheets

SUBSTRATE SUPPORTING EDGE RING WITH COATING FOR IMPROVED SOAK PERFORMANCE

CROSS-REFERENCE TO RELATED APPLICATIONS

This application is a continuation of U.S. patent application Ser. No. 13/486,807 filed Jun. 1, 2012 and issued as U.S. Pat. No. 8,979,087 on Mar. 17, 2015, which application claims priority to U.S. Provisional Patent Application Ser. No. 61/513,492, filed Jul. 29, 2011, both applications are hereby incorporated by reference herein.

BACKGROUND

1. Field

Embodiments of the present invention generally relate to methods and apparatus for processing substrates, such as a semiconductor substrate. More particularly, embodiments of the present invention provide an edge ring for supporting a peripheral edge of a substrate in a processing chamber.

2. Description of the Related Art

In the processing of substrates, such as semiconductor substrates, wafers, and flat media in the production of flat panel displays, a substrate is placed on a supporting structure in a process chamber and stably supported while suitable processing conditions are maintained in the process chamber. When the substrate is supported in the process chamber, the substrate can be heated in a controlled heating cycle to thermally process the substrate. The substrate can be heated, for example, by an array of heating lamps disposed above or below the substrate in the process chamber. The thermal processing of the substrate can be used, for example, to anneal a layer that has been implanted on the substrate, perform thermal oxidation or nitridation processes on the substrate, or facilitate chemical vapor deposition processes on the substrate.

It is generally desirable to maintain uniform temperatures across the substrate during thermal processing to provide uniform processing results. However, variations in temperature gradients across the substrate can result in non-uniform processing of the substrate. Non-uniform temperatures occur at different substrate regions because of, for example, non-uniform convective or conductive heat losses from regions of the substrate in contact with the supporting structure or other chamber components, as well as regions of the substrate that are not in contact with the supporting structure. It is particularly difficult to achieve temperature uniformity across the substrate when the substrate is heated at rapid heating rates, such as in rapid thermal processing (RTP) systems and epitaxial deposition processing systems.

To reduce the temperature gradients present in the substrate during thermal processing thereof, various substrate supporting edge rings have been utilized. The edge ring is sized to surround a periphery of the substrate and is utilized to reduce convective and/or conductive heat transfer from the substrate to other chamber components. Various materials and constructions of edge rings have been investigated. However, even such edge rings can fail to provide adequate temperature uniformity across the substrate in high temperature heat soaking processes, for example, processes having temperatures greater than about 1150 degrees C. for extended time periods (e.g. about 30 seconds or greater). In these high temperature processes, the heat differential between the edge ring and the substrate provides temperature gradients within the substrate. These temperature gradients may cause undesirable conditions such as slip (e.g., dislocation lines and/or deformation in lattice structures), warping, as well as other defects.

Accordingly, what is needed is an improved edge ring that reduces the formation of temperature gradients in the substrate during thermal processing.

SUMMARY

Embodiments of the present invention generally provide apparatus and methods for processing a substrate. More particularly, embodiments of the present invention provide a substrate supporting edge ring for supporting a substrate in a processing chamber that minimizes reflectivity differences between surfaces of a supported substrate and the surfaces of the edge ring that are exposed to radiation.

In one embodiment, a substrate support ring is provided. The substrate support ring comprises an annular body. The annular body comprises an outer band extending radially inward from an outer annular sidewall; and a substrate supporting region extending inward from an inner portion of the outer band, wherein the annular body comprises a first material that is exposed and at least a portion of the substrate supporting region is covered with a coating comprising a second material that is different than the first material.

Another embodiment provides a substrate support ring, comprising an annular body comprising a ceramic material. The annular body further comprises a first annular sidewall, an outer band extending radially outward from the first annular sidewall, a second annular sidewall coupled to the outer band, and an inner lip extending radially inward from the first annular sidewall, the inner lip comprising a substrate supporting region, wherein the substrate supporting region consists of a film comprising a refractory material.

Another embodiment provides a substrate support ring, comprising an annular body comprising a first material. The annular body further comprises a first annular sidewall, an outer band extending radially outward from the first annular sidewall, a second annular sidewall coupled to the outer band, and an inner lip extending radially inward from the first annular sidewall, wherein a periphery of the annular body includes a coating comprising a second material that is different than the first material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention provide apparatus and methods for fabricating devices on a substrate. More particularly, embodiments of the present invention provide a substrate supporting edge ring for supporting a substrate during thermal processing with improved temperature uniformity. Examples of thermal process chambers that may benefit from the invention are RADIANCE® and CENTURA® thermal processing systems, both available from Applied Materials, Inc., located in Santa Clara, Calif. Embodiments of the substrate supporting edge ring may also be utilized in thermal processing systems available from other manufacturers.

Figure 1:
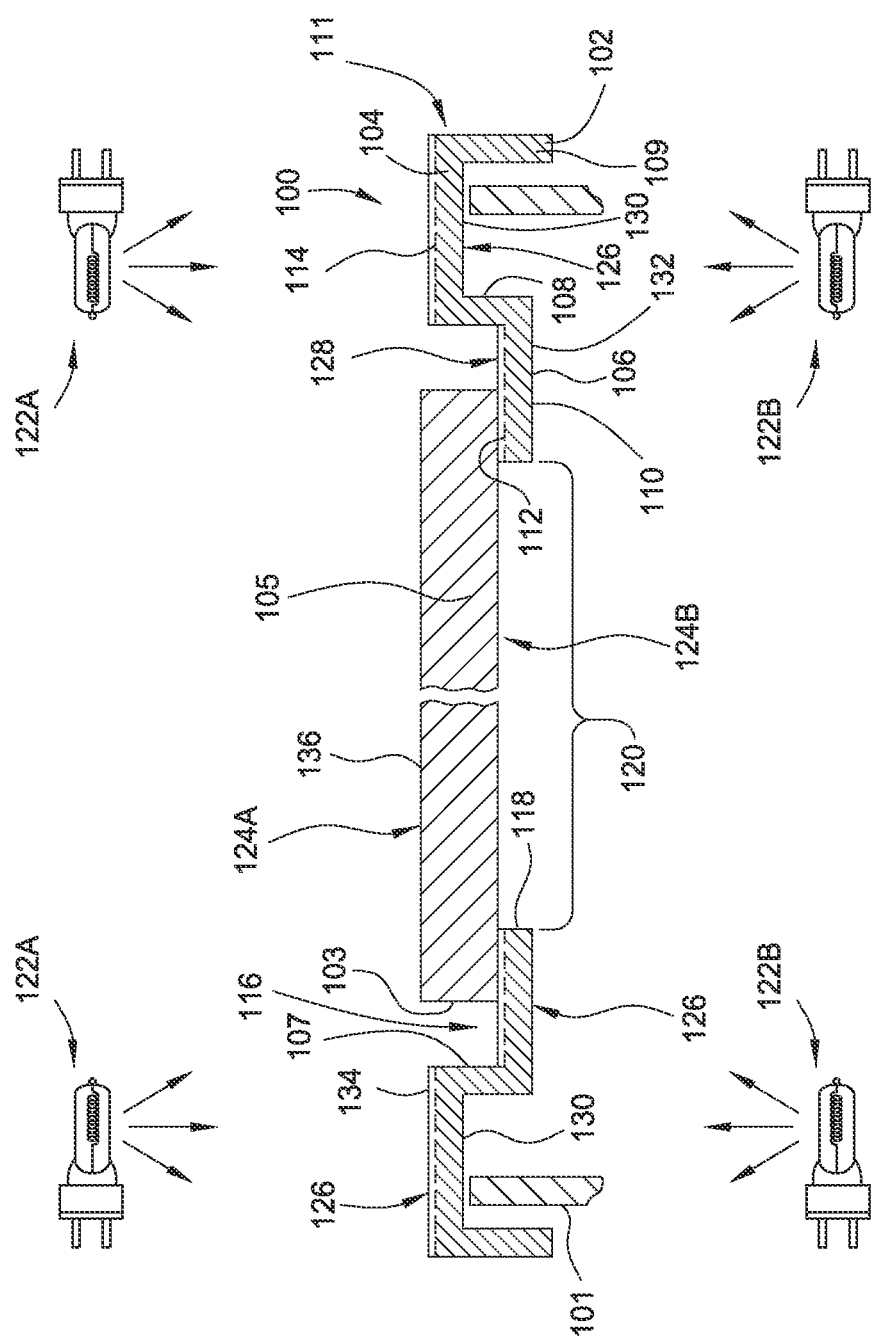
FIG. 1 is a side cross-sectional view of one embodiment of a substrate supporting edge ring.

FIG. 1 is a side cross-sectional view of one embodiment of a substrate supporting edge ring 100 that is utilized to support a substrate 105 during processing in a process chamber (not shown). The edge ring 100 is typically supported by a support member 101 in the process chamber. The support member 101 is vertically and/or rotationally movable within the process chamber. The edge ring 100 comprises an annular body 102 including an outer band 104 and an inner lip 106 that cooperate to support the substrate 105 on the support member 101 during thermal processing. The outer band 104 comprises an inner perimeter 107 that at least partially surrounds a periphery 103 of the substrate 105. The outer band 104 and the inner lip 106 may comprise substantially annular structures connected by a first annular sidewall 108. The annular body 102 of the edge ring 100 further comprises a second annular sidewall 109 that extends downwardly at an outer perimeter 111 of the outer band 104.

The inner lip 106 of the edge ring 100 extends radially inwardly from the inner perimeter 107 of the outer band 104 to form a supporting ledge 110 to support the substrate 105 thereon. A substrate support region 112 of the inner lip 106 is below a plane of an upper surface 114 of the outer band 104. A region between the first annular sidewall 108 forms a recess 116 that holds the substrate 105 within the inner perimeter 107 of the outer band 104. The inner lip 106 is sized according to the size of the substrate 105 and allow for thermal expansion of the substrate 105. The inner lip 106 is sized to support a periphery of the substrate 105. The inner lip 106 can extend a sufficient distance beneath the substrate 105, such as from about 0.1 cm to about 0.5 cm, in order to stably support the substrate 105. In the version shown in FIG. 1, an inner perimeter 118 of the supporting ledge 110 defines an open region 120 that does not support or cover at least about 75% of the surface area of the substrate 105. In some embodiments, the first annular sidewall 108 of the edge ring 100 is reduced or does not include the first annular sidewall 108 such that the substrate support region 112 is substantially coplanar with the upper surface of the outer band 104. Additionally, the edge ring 100 may also comprise rib structures configured to maintain stiffness in the edge ring 100.

The edge ring 100 is supported in a process chamber (not shown) to support the substrate 105 and facilitate exposure of the substrate 105 to radiation from heat sources, such as upper lamps 122A and/or lower lamps 122B. The upper lamps 122A are configured to direct thermal energy to a first major surface 124A of the substrate 105 while the lower lamps 122B are configured to direct thermal energy to a second major surface 124B of the substrate 105. The edge ring 100 comprises a radiation absorption surface 126, which includes surfaces of the edge ring 100 that face the upper lamps 122A or the lower lamps 122B. The radiation absorption surface 126 also includes surfaces of the edge ring 100 that are subject to conductive or radiative heating. The size of the radiation absorption surface 126 is based on dimensioning of the annular body 102 of the edge ring 100 and, in one aspect, is configured to reduce temperature gradients arising from temperature differences between the edge ring 100 and the substrate 105 at the periphery 103 of the substrate 105.

The edge ring 100 may be utilized to artificially increase the size of the substrate 105 so that heat loss and/or temperature gradients that may occur at the edge region of the substrate 105 is removed from the substrate 105 and effectively transferred to the edge ring 100. For example, the edge ring 100 may be utilized to extend the diameter of the substrate 105 from a thermal perspective in order to promote thermal uniformity in the substrate 105 and move any temperature gradients that may occur into the annular body 102 of the edge ring 100.

When the upper lamps 122A are utilized to heat the substrate 105, the radiation absorption surface 126 comprises a portion of a top surface of the edge ring 100 that is exposed to the upper lamps 122A. For example, the radiation absorption surface 126 can be a portion of the upper surface 114 of the outer band 104, and may even comprise the entire upper surface 114 of the outer band 104, as well as portions of the outer perimeter 111. The radiation absorption surface 126 can also comprise an exposed surface portion 128 of the inner lip 106 that is between the periphery 103 of the substrate 105 and an inner perimeter 107 of the outer band 104. When the lower lamps 122B are utilized to heat the substrate 105, the radiation absorption surface 126 can be a portion of a lower surface 130 of the outer band 104, a lower surface 132 of the inner lip 106, and at least a portion of the first annular sidewall 108 as well as the second annular sidewall 109.

The edge ring 100 further includes a coating 134 disposed on one or more surfaces of the annular body 102. In one embodiment, the coating 134 is disposed on at least portion of the surfaces of the edge ring 100 that are exposed to radiation from the upper lamps 122A when the upper lamps 122A are utilized to heat the substrate 105. In another embodiment (not shown in FIG. 1), the coating 134 is disposed on at least portion of the surfaces of the edge ring 100 that are exposed to radiation from the lower lamps 122B when the lower lamps 122B are utilized to heat the substrate 105. The coating 134 may also be disposed on surfaces of the inner lip 106.

In one aspect, the coating 134 is utilized to equalize a radiation absorption delta between the surface(s) of the substrate 105 and the radiation absorption surface 126 of the edge ring 100 during heating of the substrate 105. During processing, the surfaces of the substrate 105 may absorb or reflect the radiation from the lamps 122A, 122B at a different rate than the radiation absorption surface 126 of the edge ring 100. For example, when the upper lamps 122A are utilized to heat the substrate 105, the first major surface 124A of the substrate 105 may comprise film layers formed thereon that are reflective as compared to the reflectivity of the radiation absorption surface 126 of the edge ring 100. Thus, the radiation absorption surface(s) 126 of the edge ring 100 may absorb more heat than the substrate 105. The substrate 105, which is supported on the supporting ledge 110 of the edge ring 100, may conduct heat from the edge ring 100, which causes the periphery 103 of the substrate 105 to have a higher temperature than portions of the substrate 105 inside the periphery 103. The difference in temperature of the substrate 105 across these regions may cause slip, warping or other abnormality in the substrate 105 to occur.

The annular body 102 of the edge ring 100 comprises a core or base made of a first material, such as sintered silicon carbide (SiC) and the coating 134 comprises a second material that is different than the first material. Other materials for the first material may include oxidized SiC (e.g., silicon dioxide ($SiO_2$) grown on SiC), graphite coated with SiC, graphite coated with glassy carbon, and combinations thereof. The coating 134 may be a silicon film, a ceramic film, an oxide film, or combinations thereof, that is utilized to cover portions of the SiC base material. In one aspect, the coating 134 is configured to minimize the absorption delta between the substrate and the edge ring 100. In one embodiment, the coating 134 provides an emissivity that is substantially near or equal to the emissivity of the surface of the substrate 105 that is exposed to radiation from the lamps 122A and/or 122B. For example, if the upper lamps 122A are utilized to heat the first major surface 124A of the substrate 105 having one or more films 136 disposed thereon that includes a first emissivity, the coating 134 disposed on portions of the edge ring 100 that are exposed to radiation from the upper lamps 122A may comprise one or more films having a second emissivity that is substantially equal to the first emissivity. In one example, the first major surface 124A of the substrate 105 may include a film 136 comprising silicon, such as amorphous silicon, monocrystalline silicon, polycrystalline silicon, and combinations thereof. The film 136 may also comprise nitride layers, such as silicon nitride, oxide layers, such as silicon oxide, buried oxide layers, and the like, as well as stacked layers, such as dielectric stacks and silicon on insulator (SOI). The coating 134 disposed on portions of the edge ring 100 that are exposed to radiation from the upper lamps 122A may comprise one or more layers that include an emissivity that is substantially equal to the emissivity of the film 136.

Likewise, when the lower lamps 122B are utilized to heat the substrate 105, the second major surface 124B of the substrate 105 may be bare, or comprise film layers formed thereon, that includes a first emissivity. The coating 134 disposed on portions of the edge ring 100 that are exposed to radiation from the lower lamps 122B may comprise one or more films having a second emissivity that is substantially equal to the first emissivity. In one example, the second major surface 124B of the substrate 105 may be bare silicon. Thus, the coating 134 disposed on portions of the edge ring 100 that are exposed to radiation from the lower lamps 122B may comprise one or more layers of silicon that provides an emissivity that is substantially equal to the emissivity of the second major surface 124B of the substrate 105.

Figure 2:
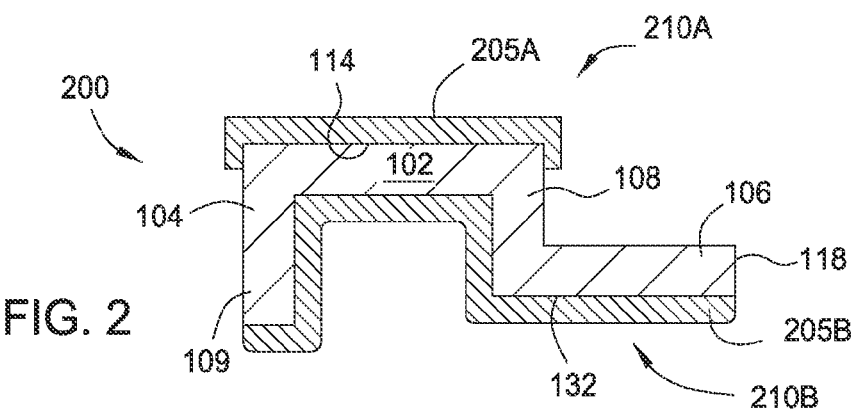
FIG. 2 is a side cross-sectional view of another embodiment of an edge ring.

FIG. 2 is a side cross-sectional view of one embodiment of an edge ring 200 that may be utilized to support the substrate 105 of FIG. 1. The edge ring 200 includes a first coating 205A disposed on an upper radiation absorption surface 210A and a second coating 205B disposed on a lower radiation absorption surface 210B. The first coating 205A may be a silicon containing film, such as amorphous silicon, monocrystalline silicon, polycrystalline silicon, and combinations thereof. The silicon containing film of the first coating 205A is chosen to have an emissivity that substantially equals the emissivity of the material on a to-be-processed substrate (not shown). The first coating 205A may cover the upper surface of the outer band 104 and may partially overlap the first annular sidewall 108 as well as the second annular sidewall 109. The material of the second coating 205B may be a silicon containing film, such as amorphous silicon, monocrystalline silicon, polycrystalline silicon, and combinations thereof. The second coating 205B may substantially cover the entire bottom surface of the annular body 102 of the edge ring 200. The silicon containing film of the second coating 205B may be chosen to have an emissivity that substantially equals the emissivity of the surface of a to-be-processed substrate (not shown). For example, the emissivity of the second coating 205B may be substantially equal to the emissivity of bare silicon.

Figure 3:
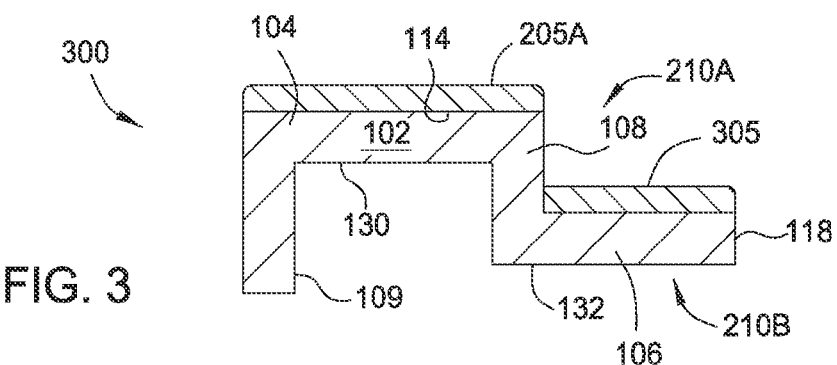
FIG. 3 is a side cross-sectional view of another embodiment of an edge ring.

FIG. 3 is a side cross-sectional view of another embodiment of an edge ring 300 that may be utilized to support the substrate 105 of FIG. 1. The edge ring 300 includes the first coating 205A disposed on the upper radiation absorption surface 210A similar to the edge ring 200 shown in FIG. 2 with the exception of a sharp termination of the first coating 205A on the outer band 104. The edge ring 300 also does not include a coating on the lower surfaces 130, 132 of the annular body 102 of the edge ring 300. Additionally, the inner lip 106 includes a refractory coating 305. The refractory coating 305 is configured to reduce bonding with and/or minimize scratching of the substrate 105 (not shown).

During rapid thermal processes (RTP), the high temperatures used for annealing the substrate 105 sometimes causes silicon to stick to or otherwise bond with the annular body 102 of the edge ring 300. Sticking of the substrate 105 and the edge ring 300 may also occur in high temperature epitaxial deposition processes. The refractory coating 305 is a material having high temperature resistance and a high hardness. Refractory as used herein refers to materials having physical and chemical properties that do not degrade in temperatures in excess of about 600 degrees C. The refractory coating 305 may be a ceramic material, sapphire, or a carbon material, such as glassy carbon, graphite, diamond-like carbon, vitreous carbon, combinations thereof and derivatives thereof. The refractory coating 305 may also be a an oxide film, such as aluminum oxide ($Al_2O_3$), beryllium oxide (BeO), zirconium dioxide ($ZrO_2$), hafnium oxide ($HfO_2$), yttrium oxide ($Y_2O_3$), thorium oxide ($ThO_2$), scandium oxide ($Sc_2O_3$), rare earth oxides, combinations thereof and derivatives thereof. The refractory coating 305 may also be composed of nitrides such as zirconium nitride (ZrN) or hafnium nitride (HfN). While the first coating 205A may be utilized to match the emissivity of the to-be-processed substrate, the emissivity of the refractory coating 305 may be different than the emissivity of the first coating 205A and/or the emissivity of the to-be-processed substrate. The emissivity mismatch between the first coating 205A and the refractory coating 305 does not significantly affect thermal properties of the edge ring 300 as the majority of the refractory coating 305 is shielded from radiation by the periphery of the substrate (not shown).

Figure 4:
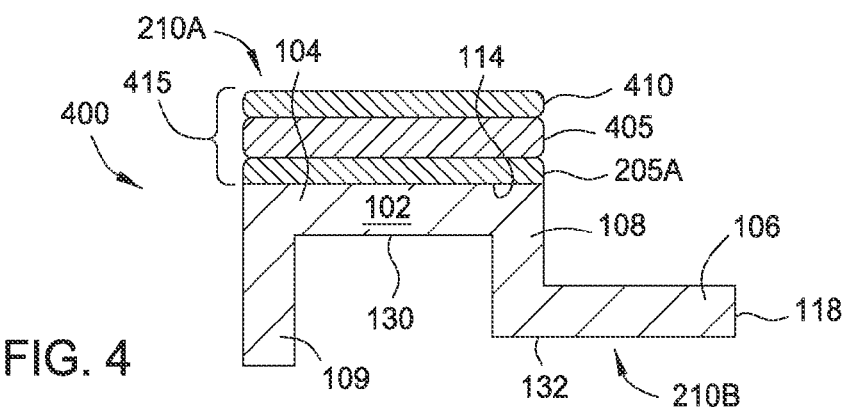
FIG. 4 is a side cross-sectional view of another embodiment of an edge ring.

FIG. 4 is a side cross-sectional view of another embodiment of an edge ring 400 that may be utilized to support the substrate 105 of FIG. 1. The edge ring 400 includes the first coating 205A disposed on an upper radiation absorption surface 210A. In this embodiment, a second coating 405 is formed over the first coating 205A and a third coating 410 is formed over the second coating 405.

The first coating 205A may be a silicon containing film, such as amorphous silicon, monocrystalline silicon, polycrystalline silicon, and combinations thereof. The second coating 405 may comprise an oxide film, such as silicon dioxide ($SiO_2$). The third coating 410 may comprise a silicon containing film, such as amorphous silicon, monocrystalline silicon, polycrystalline silicon, and combinations thereof. In one example, the first coating 205A comprises monocrystalline silicon, the second coating 405 comprises $SiO_2$, and the third coating 410 comprises epitaxial silicon.

In one aspect, the combination of the first coating 205A, the second coating 405 and the third coating 410 comprises a dielectric film stack 415. The emissivity of the dielectric film stack 415 substantially equals the emissivity of the material on a to-be-processed substrate (not shown). In one example, the edge ring 400 having the dielectric film stack 415 may be utilized in the processing of SOI substrates as the emissivity of the dielectric film stack 415 is substantially equal to the emissivity of the SOI substrate.

In another embodiment, the dielectric film stack 415 comprises alternating layers of refractory materials having different indices of refraction. For example, the first coating 205A, the second coating 405 and the third coating 410 may comprise alternating layers of silicon (Si), silicon oxide ($SiO_2$), silicon carbide (SiC), aluminum oxide ($Al_2O_3$), beryllium oxide (BeO), zirconium dioxide ($ZrO_2$), hafnium oxide ($HfO_2$), yttrium oxide ($Y_2O_3$), thorium oxide ($ThO_2$), scandium oxide ($Sc_2O_3$), rare earth oxides, and combinations thereof. The first coating 205A, the second coating 405 and the third coating 410 may also comprise alternating layers of nitrides, such as silicon nitride ($Si_3N_4$), zirconium nitride (ZrN), hafnium nitride (HfN), and combinations thereof. One or more of the first coating 205A, the second coating 405 and the third coating 410 may also comprise titanium dioxide ($TiO_2$), tantalum pentoxide ($Ta_2O_5$), and combinations thereof.

Figure 5:
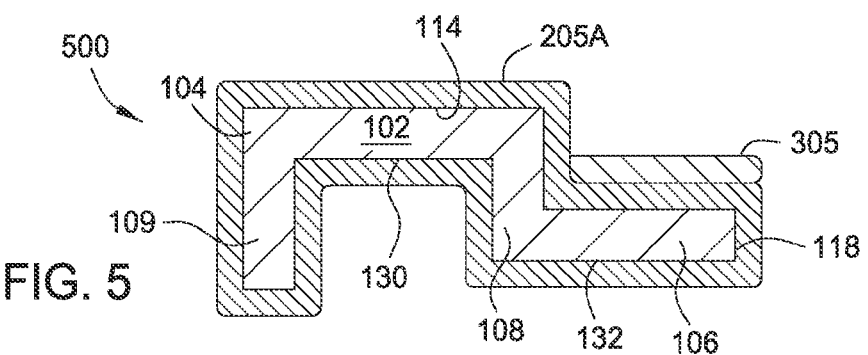
FIG. 5 is a side cross-sectional view of one embodiment of an edge ring.

FIG. 5 is a side cross-sectional view of one embodiment of an edge ring 500 that may be utilized to support the substrate 105 of FIG. 1. The edge ring 500 includes the first coating 205A substantially surrounding the annular body 102 of the edge ring 500. Additionally, the refractory coating 305 is disposed on the first coating 205A. The first coating 205A may be a silicon containing film, such as amorphous silicon, monocrystalline silicon, polycrystalline silicon, and combinations thereof. The refractory coating 305 may be a ceramic material, sapphire, or a carbon material, such as glassy carbon, graphite, diamond-like carbon, vitreous carbon, combinations thereof and derivatives thereof. The refractory coating 305 may also be a an oxide film, such as aluminum oxide ($Al_2O_3$), beryllium oxide (BeO), zirconium dioxide ($ZrO_2$), hafnium oxide ($HfO_2$), yttrium oxide ($Y_2O_3$), thorium oxide ($ThO_2$), scandium oxide ($Sc_2O_3$), rare earth oxides, combinations thereof and derivatives thereof. The refractory coating may also be composed of nitrides such as zirconium nitride (ZrN) or hafnium nitride (HfN), combinations thereof and derivatives thereof.

Each of the coatings 205A, 205B, 305, 405 and 410 may be formed by chemical vapor deposition (CVD), physical vapor deposition (PVD), plasma spray, heat-treated sol-gel, or other suitable film formation process. Various factors may be considered to improve or modify the absorptivity of the edge ring 100, 200, 300, 400 and 500 according to process requirements. Exemplary factors include, but are not limited to, the ratio of area of the edge ring 100, 200, 300, 400 or 500 exposed to radiation and the thermal mass of the annular body 102, thermal conductivity along the radial direction, thermal conductivity along the azimuthal direction, and stiffness of the annular body 102. Each of the coatings 205A, 205B, 305, 405 and 410 may be continuous across the surfaces of the annular body 102 or be deposited in a discontinuous pattern on the annular body 102. For example, the coatings 205A, 205B, 305, 405 and 410 may be in a pattern of patches to form a continuous or random or pattern which, together with the exposed surface of the substrate, forms a region that provides a desired absorptivity over a length scale of a few millimeters. For example, the size of an averaged region may be about 1 mm to about 10 mm (characteristic length) for the desired absorptivity matching. Additionally, the refractory coating 305 formed on the substrate support region 112 may be disposed in three or more pad-like patches. The pad-like patches may be spaced at interval in order to stably support the substrate.

Figure 6:
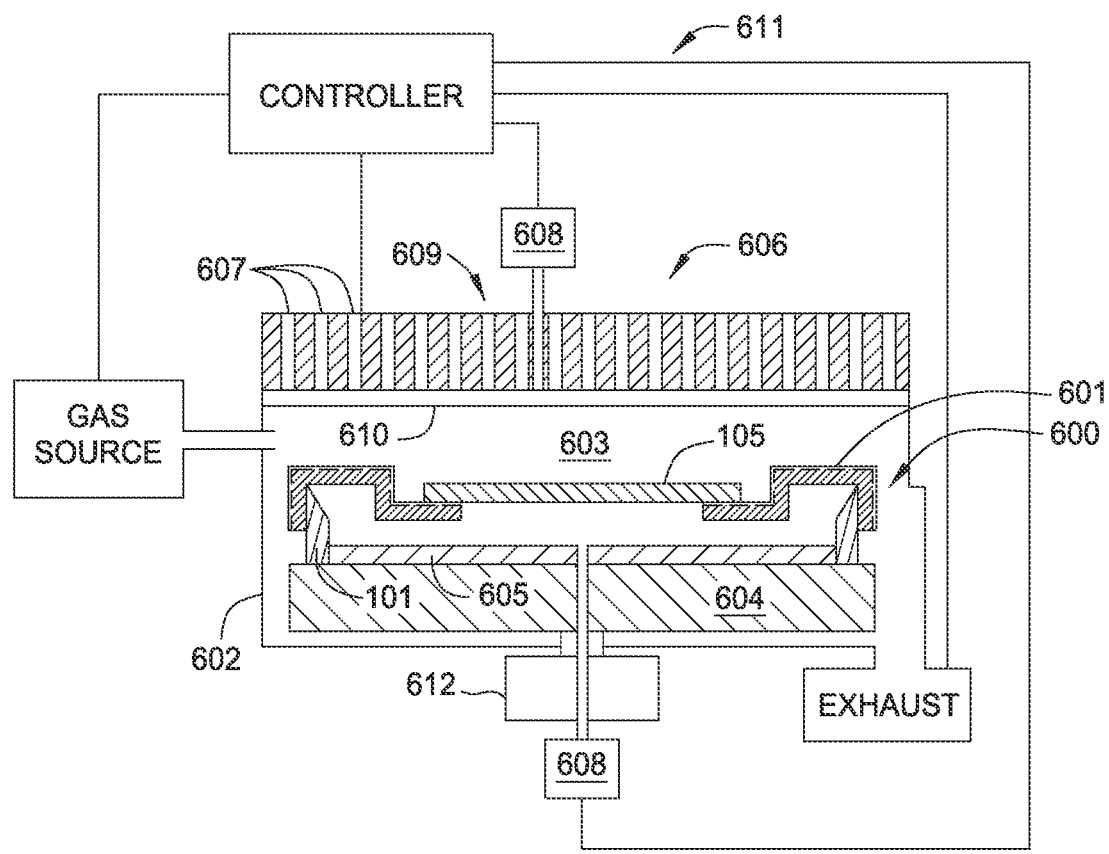
FIG. 6 is a simplified cross-sectional view of one embodiment of a process chamber suitable for use with embodiments of an edge ring as described herein.

FIG. 6 is a simplified cross-sectional view of one embodiment of a process chamber 600 suitable for use with a substrate support ring 601, which may be any one of or a combination of the edge rings 100, 200, 300, 400 and 500 as described herein. The process chamber 600 may be a rapid thermal process chamber capable of providing a controlled thermal cycle that heats the substrate 105 for processes such as, for example, thermal annealing, thermal cleaning, thermal chemical vapor deposition, thermal oxidation and thermal nitridation. The process chamber 600 comprises chamber walls 602 enclosing a processing zone 603. A substrate support 604 having the support member 101 is disposed in the process chamber 600. The substrate support 604 may be rotationally and/or vertically movable to support the substrate support ring 601 and the substrate 105 during processing in the processing zone 603. The substrate support 604 may be coupled to a drive system 612 to move the support member 101 vertically and/or rotationally. The substrate support 604 may further comprise a reflective plate 605 positioned below the substrate 105 to reflect radiation from a heat source 606 opposing the substrate support 604. The heat source 606 may comprise one or more light pipe assemblies 607 each having a lamp therein that directs radiation to the upper surface of the substrate support ring 601 and the substrate 105. One or more temperature sensors 608, such as pyrometers having fiber optic probes, can also be provided to detect the temperature of the substrate 105 during processing.

The heat source 606 generates radiation at wavelengths that heat the substrate 105 and the substrate support ring 601, such as radiation having wavelengths of from about 0.2 microns to about 5 microns. In one version, the heat source 606 comprises a honeycomb array 609 of light pipe assemblies 607 in a fluid-cooled jacket. The honeycomb array 609 can comprise one or more radial heating zones that can be independently modulated to control temperatures across the substrate 105. The heat source 606 is capable of rapidly heating the substrate 105 for thermal processing, for example at a rate of about 50 degrees C. per second to about 300 degrees C. per second, and even at least to about 200 degree C. per second. A radiation-permeable window 610, such as a quartz window, facilitates the transfer of radiation from the heat source 606 to the substrate 105. Process supply and environmental controls, such as gas supply, exhaust and a controller, are collectively referred to as a support system 611. The support system 611 components shown are not exhaustive and are readily apparent to those of skill in the art. Thus, the support system 611 is not described further for brevity.

Figure 7:
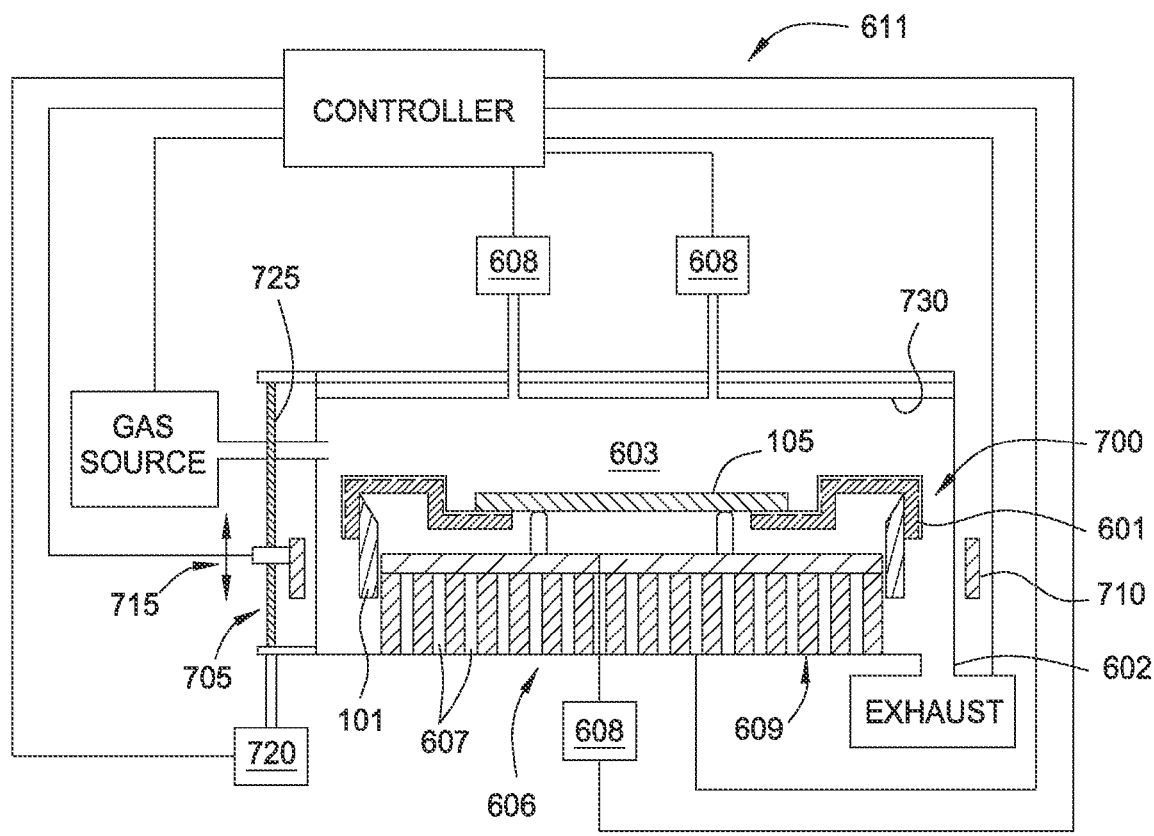
FIG. 7 is a simplified cross-sectional view of another embodiment of a process chamber suitable for use with embodiments of an edge ring as described herein.

FIG. 7 is a simplified cross-sectional view of another embodiment of a process chamber 700 suitable for use with the substrate support ring 601, which may be any one of or a combination of the edge rings 100, 200, 300, 400 and 500 as described herein. The process chamber 700 is similar to the process chamber 600 described in FIG. 6 with a few notable exceptions.

In this embodiment, the process chamber 700 comprises a heat source 606 disposed below the substrate 105. The heat source 606 is disposed within an inner diameter of the support member 101. The support member 101, which supports the substrate support ring 601, may be actuated vertically and/or rotationally by a magnetic drive 705 disposed at least partially outside of the chamber wall 602. The magnetic drive 705 comprises a stator assembly 710 that is coupled to a drive system 715. In one embodiment, the drive system 715 comprises an actuator 720 coupled to a threaded rod 725. The threaded rod 725 moves the stator assembly 710 vertically by actuation of the actuator 720. When the stator assembly 710 is actuated, the stator assembly 710 magnetically couples with the support member 101, which causes the movement of the support member 101 vertically. Modulation of the current in the stator assembly 710 causes rotation of the support member 101. The process chamber 700 also comprises a plate 730 disposed in the processing zone 603. The plate 730 may be a reflector utilized to reflect radiation from the heat source 606. Alternatively, the plate 730 may be a cooling device adapted to absorb energy that is utilized to cool the substrate 105. Control of the magnetic drive 705 provides precise movement control of the substrate 105 between the heat source 606 and the plate 730, which may be utilized to control the temperature of the substrate 105.

Various embodiments of an edge ring 100, 200, 300, 400 or 500 are provided. Each of the edge rings 100, 200, 300, 400 and 500 are suitable for use in high temperature processing, particularly in high temperature soak processes. Embodiments of the present invention provide an edge ring for supporting a substrate with increased temperature uniformity. Coatings provided on the outer surface of the edge rings 100, 200, 300, 400 and 500 provide a radiation absorption surface that substantially matches the surface of a to-be-processed substrate in order to minimize the absorption delta between the surface of the substrate and surfaces of the edge ring that are exposed to radiation. In some embodiments, a coating is provided on the substrate supporting surface of the edge ring. The coating minimizes or eliminates sticking of the substrate to the edge ring during high temperature processing.

While the foregoing is directed to embodiments of the present invention, other and further embodiments of the invention may be devised without departing from the basic scope thereof, and the scope thereof is determined by the claims that follow.

What is claimed is:

1. A substrate support ring, comprising:
   an annular body comprising a ceramic material that includes:
      an outer band comprising a film extending radially inward from an outer sidewall of the annular body, the film comprising a first silicon layer, an oxide layer, and a second silicon layer disposed on the oxide layer; and
      a substrate supporting region extending inward from an inner portion of the outer band.

2. The ring of claim 1, wherein the first or second silicon layer is selected from the group consisting of amorphous silicon, monocrystalline silicon, and polycrystalline silicon.

3. The ring of claim 1, wherein the film is provided as discontinuous patches on the outer band.

4. The ring of claim 1, wherein the film covers the entirety of the outer band.

5. The ring of claim 1, wherein the ceramic material comprises silicon carbide.

6. The ring of claim 1, wherein the substrate supporting region has a film layer disposed thereon.

7. The ring of claim 6, wherein the film layer is selected from the group consisting of a ceramic material, sapphire, and a carbon material.

8. The ring of claim 6, wherein the film layer is selected from the group consisting of an oxide film, a nitride film, and combinations thereof.

9. The ring of claim 6, wherein the film layer is selected from the group consisting of aluminum oxide ($Al_2O_3$), beryllium oxide (BeO), zirconium dioxide ($ZrO_2$), hafnium oxide ($HfO_2$), yttrium oxide ($Y_2O_3$), thorium oxide ($ThO_2$), scandium oxide ($Sc_2O_3$), rare earth oxides, zirconium nitride (ZrN), hafnium nitride (HfN), and combinations thereof.

10. A substrate support ring, comprising:
    an annular body comprising a ceramic material, the annular body comprising:
       a first sidewall;
       an outer band extending radially outward from the first sidewall, the outer band comprising a film having a first silicon layer, an oxide layer, and a second silicon layer disposed on the oxide layer, the first or second silicon layer selected from the group consisting of amorphous silicon, monocrystalline silicon, and polycrystalline silicon;
       a second sidewall extending from the outer band; and
       a substrate supporting region extending radially inward from the first sidewall.

11. The ring of claim 10, wherein the film is provided as discontinuous patches on the outer band.

12. The ring of claim 10, wherein the film covers the entirety of the outer band.

13. The ring of claim 10, wherein the substrate supporting region comprises a refractory film layer disposed on the ceramic material.

14. The ring of claim 13, wherein the refractory film layer is selected from the group consisting of aluminum oxide ($Al_2O_3$), beryllium oxide (BeO), zirconium dioxide ($ZrO_2$), yttrium oxide ($Y_2O_3$), and combinations thereof.

15. A substrate support ring, comprising:
    an annular body comprising a first material, the annular body comprising:
       a first sidewall;
       an outer band extending radially outward from the first sidewall, the outer band comprising a coating made of a second material that is different than the first material;
       a second sidewall extending from the outer band; and
       a substrate supporting region extending radially inward from the first sidewall and having a surface disposed in a plane that is parallel to a plane of the outer band.

16. The ring of claim 15, wherein the first material comprises silicon carbide and the second material comprises a first silicon layer, an oxide layer, and a second silicon layer disposed on the oxide layer.

17. The ring of claim 16, wherein the first or second silicon layer comprises a film selected from the group consisting of amorphous silicon, monocrystalline silicon, and polycrystalline silicon.

18. The ring of claim 15, wherein the second material is a film selected from the group consisting of alternating layers of silicon, silicon oxide, aluminum oxide, beryllium oxide, zirconium dioxide, hafnium oxide, yttrium oxide, thorium oxide, scandium oxide, rare earth oxides, and combinations thereof.

19. The ring of claim 15, wherein the second material is continuous across the outer band.

20. The ring of claim 15, wherein the second material is provided as discontinuous patches on the outer band.

21. A substrate support ring, comprising:
    an annular body comprising a first material, the annular body comprising:
       a first sidewall;

an outer band extending radially outward from the first sidewall, the outer band comprising a coating made of a second material that is different than the first material;
a second sidewall extending from the outer band; and
a substrate supporting region extending radially inward from the first sidewall, wherein the second material is provided as discontinuous patches on the outer band.

* * * * *